United States Patent
Dempsey et al.

(10) Patent No.: US 6,823,416 B1
(45) Date of Patent: Nov. 23, 2004

(54) METHOD AND APPARATUS FOR DEVICE INTERFACE

(75) Inventors: Dennis A. Dempsey, Co. Limerick (IE); Thomas G. O'Dwyer, Co. Clare (IE); Oliver James Brennan, Co. Limerick (IE); Helen Stapleton, Co. Limerick (IE); Alan Walsh, Co. Offaly (IE); Tudor Vinereanu, Cork (IE)

(73) Assignee: Analog Devices, Inc., Norwood, MA (US)

( * ) Notice: Subject to any disclaimer, the term of this patent is extended or adjusted under 35 U.S.C. 154(b) by 503 days.

(21) Appl. No.: 09/837,659

(22) Filed: Apr. 18, 2001

(51) Int. Cl.⁷ .............................................. G06F 13/00
(52) U.S. Cl. ...................... 710/305; 710/100; 341/144; 713/401
(58) Field of Search ................................ 710/100, 305; 341/141, 142, 143, 144; 713/400, 401

(56) References Cited

U.S. PATENT DOCUMENTS

| | | | | |
|---|---|---|---|---|
| 3,792,430 A | * | 2/1974 | Niven, Jr. ................. | 340/854.1 |
| 4,366,469 A | * | 12/1982 | Michaels et al. ........... | 341/139 |
| 4,538,184 A | * | 8/1985 | Otsuka et al. ............. | 358/3.01 |
| 4,665,382 A | * | 5/1987 | Morgan ...................... | 341/122 |
| 4,777,470 A | * | 10/1988 | Naylor et al. ............... | 341/163 |
| 4,796,006 A | * | 1/1989 | Murray et al. .............. | 341/144 |
| 4,800,365 A | * | 1/1989 | White et al. ................ | 341/119 |
| 4,874,251 A | * | 10/1989 | Thomas et al. ............. | 374/45 |
| 4,937,574 A | * | 6/1990 | Wright ....................... | 341/106 |
| 4,940,981 A | * | 7/1990 | Naylor et al. ............... | 341/161 |
| 5,023,483 A | * | 6/1991 | May ............................ | 326/105 |
| 5,084,704 A | * | 1/1992 | Parrish ...................... | 341/164 |
| 5,159,688 A | * | 10/1992 | Matsushima et al. ....... | 710/261 |
| 5,347,190 A | * | 9/1994 | Lewis et al. ............... | 310/90.5 |
| 5,621,409 A | * | 4/1997 | Cotter et al. ................ | 341/156 |
| 5,691,719 A | * | 11/1997 | Wakimoto ................... | 341/141 |
| 6,169,501 B1 | * | 1/2001 | Ryan ......................... | 341/101 |
| 6,201,492 B1 | * | 3/2001 | Amar et al. ................ | 341/155 |

* cited by examiner

Primary Examiner—Xuan M. Thai
(74) Attorney, Agent, or Firm—Wolf, Greenfield & Sacks, P.C.

(57) ABSTRACT

A method for communicating between a controller and a device with double-buffered inputs comprises the steps of providing one or more communication paths for exchanging data between the controller and the device, providing a data transfer control signal from the controller to the device for transferring input data from one or more input registers into one or more latchable data registers, and providing a data transfer delay signal from the device to the controller, wherein, in a first logic state, the data transfer delay signal prevents transfer of input data from the input registers into the latchable data registers until after a transition to a second logic state occurs on the data transfer delay signal. An apparatus for communicating between a controller and a device is also described.

26 Claims, 5 Drawing Sheets

METHOD AND APPARATUS FOR DEVICE INTERFACE

FIELD OF THE INVENTION

This invention relates generally to an interface protocol for a device and in particular to an interface between an external controller and multiple devices arranged in a bus configuration, and is more particularly directed toward a method and apparatus for communicating between a microcontroller and a plurality of bus-compatible data conversion devices.

BACKGROUND OF THE INVENTION

Data conversion products provide the necessary bridge between analog and digital worlds. Analog-to-digital converter (ADC) products allow digital system elements, such as microprocessors and digital signal processors (DSPs) to sample analog signals, while digital-to-analog converters (DACs) permit these digital system element to generate smooth, time-varying voltages and currents. ADCs find many specific applications in modern systems, including the sampling of speech signals for telecommunications uses, while DACs are often employed to generate speech or music waveforms, to function as programmable voltage or current sources, or to precisely control analog signal levels.

Figure 1:
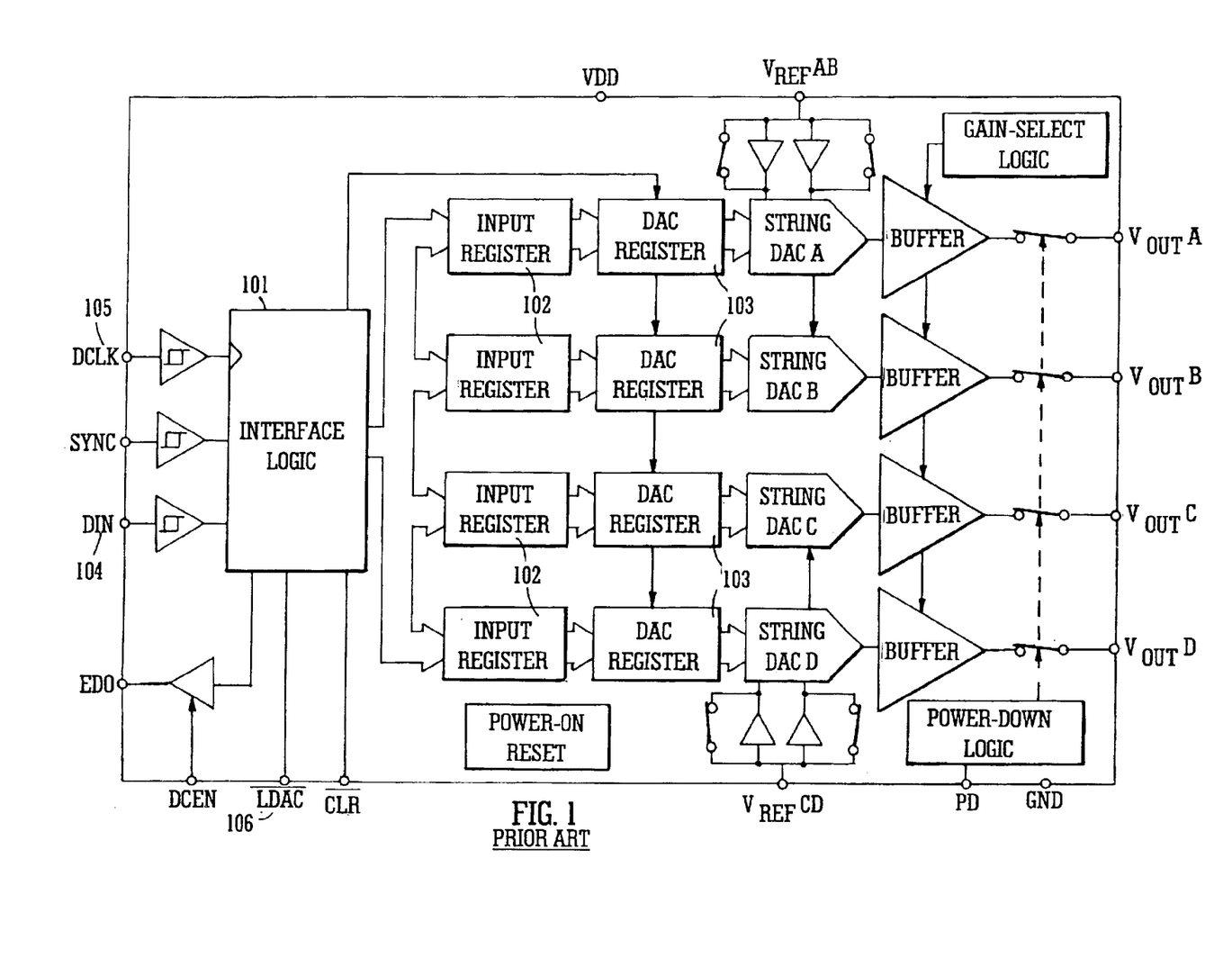
FIG. 1 depicts, in block diagram form, a data conversion device of the prior art.

For complex signal generation, it may be necessary for a single microprocessor or DSP to control multiple DACs. FIG. 1 illustrates, in block diagram form, a data conversion device 100 of the prior art that includes multiple DACs. Although there are a number of examples of both parallel and serial interface DACs, the device 100 is designed to communicate with an external controller or processor over a serial interface.

Figure 2:
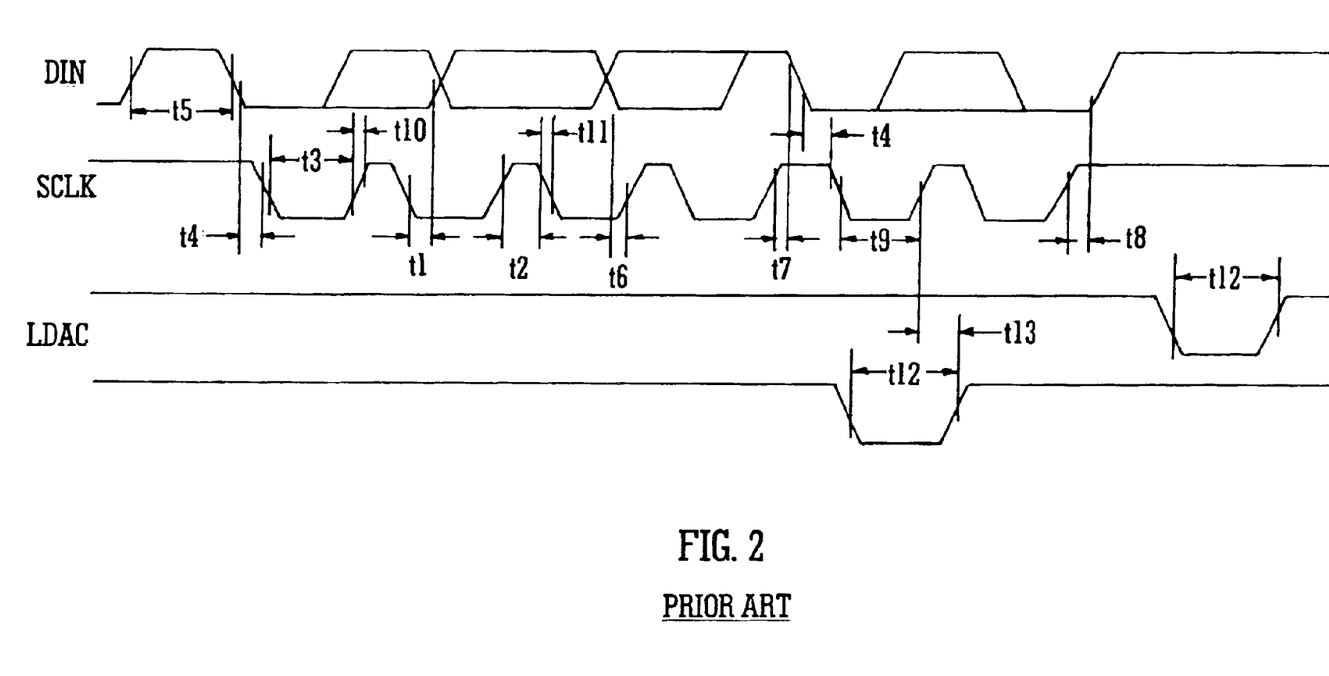
FIG. 2 is a timing diagram that illustrates operation of the device of FIG. 1.

The external controller (not shown) transmits data to the device 100 over serial data line DIN 104, in conjunction with a serial clock signal SCLK 105. The upper portion of the timing diagram of FIG. 2 illustrates a typical data transmission, in which data bits transmitted from the controller on the data line DIN 104 are shifted in on low to high transitions of the serial clock SCLK 105. It is customary in devices such as the device 100 to provide some means for addressing particular data to a specific one of the input registers 102 provided in the device 100.

The device 100 is an example of a double-buffered device. Each of the DACs within the device 100 has an associated input register 102 and an interconnected DAC input data register 103. If the LDAC signal 106 is held in a high logic state by the external controller, the internal DAC data registers 103 are maintained in a latched condition. That is, the data in the input registers 102 may be changed at will without affecting the DAC register 103 contents. In one mode of operation, when all DAC input registers 102 have been programmed with the desired data using the serial interface, the LDAC signal 106 is brought to a logic low level, which latches the data in the input registers 102 into the DAC data registers 103, resulting in a simultaneous update (and corresponding output voltage changes) for all DACs in the device 100. This is referred to as asynchronous operation, since DAC update is not tied to the operation of loading data into the input registers 102.

It is worth noting that synchronous operation, in which data is transferred from an individual input register 102 into its associated DAC register 103 immediately upon completion of input data loading over the serial interface, is also supported. For the device 100, this mode of operation can be selected by tying the LDAC signal 106 to a low logic state.

As will be appreciated, rapid loading of input registers 102 may be accomplished over the serial interface, followed by a simultaneous transfer of all input data into the DAC registers 103. However, the microcontroller or DSP that is controlling the device 100 has no way of knowing how fast it may update the input register 102 data. Even if conversion of the digital input data into an analog output voltage has not been completed, the input registers 102 can still be loaded with new data, and this new data can be readily transferred into the DAC registers 103.

Figure 3:
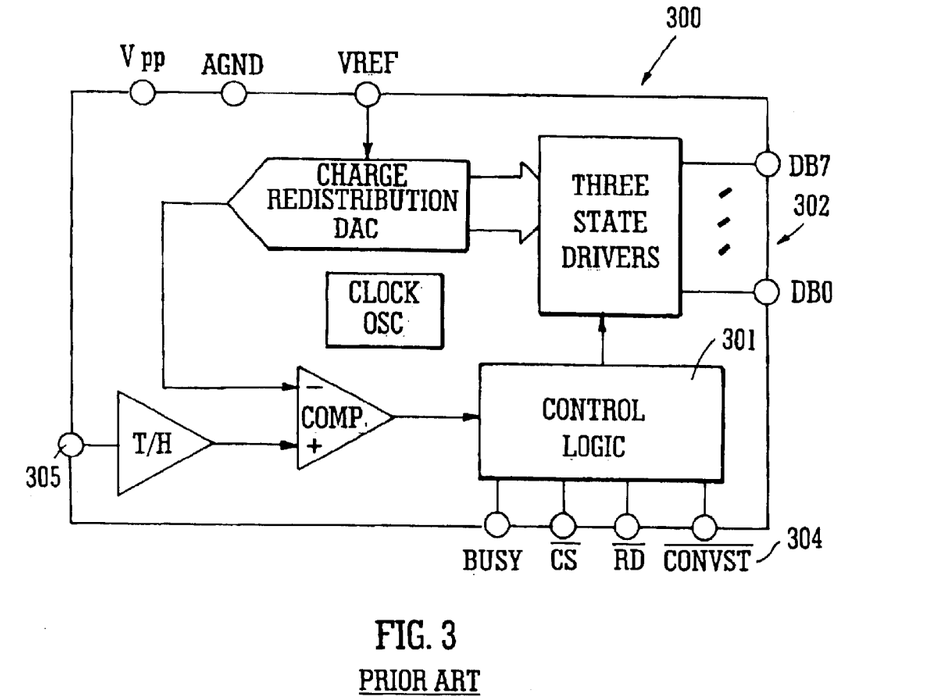
FIG. 3 is a block diagram of another data conversion device of the prior art.

At least for analog-to-digital converters, this uncertainty as to completion of data conversion has been minimized through the use of a BUSY signal. FIG. 3 depicts, in block diagram form, an ADC 300 of the prior art that incorporates a BUSY signal.

Figure 4:
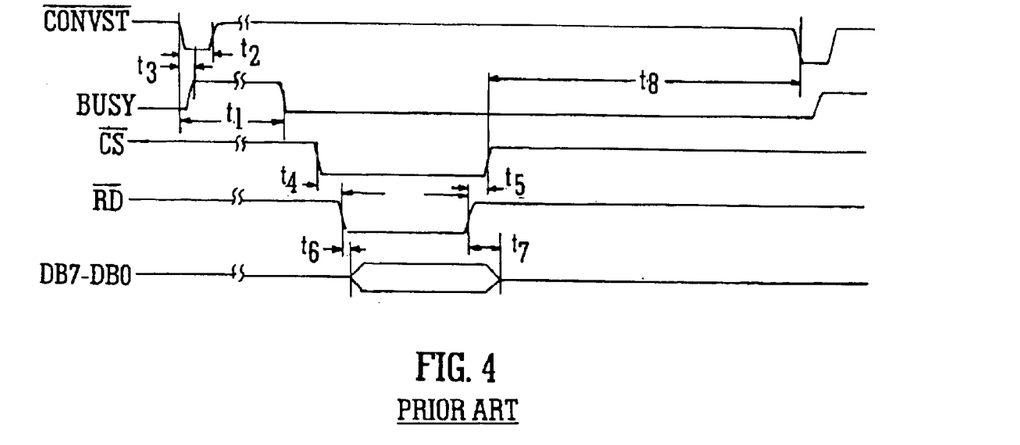
FIG. 4 is a timing diagram that illustrates operation of the device of FIG. 3.

The ADC 300 is a parallel interface device that presents eight data bits in a data bus 302 for interconnection with an associated controller (not shown), such as a microcomputer or DSP. In order to initiate a conversion of an analog input voltage 305, the controller asserts control signal CONVST 304, an input to the device 300. Upon detecting the active transition of CONVST 304, as shown in the timing diagram of FIG. 4, the control logic 301 of the ADC device 300 begins the data conversion process, and also asserts device output BUSY 303 by bringing the BUSY signal 303 to a logic high state.

When the BUSY signal 303 is in its logic high state, it signals to the external controller that a conversion is in progress. After the BUSY signal returns to its logic low level, the external controller may read the conversion result over the data bus 302. Of course, the return of the BUSY signal 303 to its low logic level merely signals that data conversion has been completed. The external controller is not prevented from reading the contents of the ADC data register over the data bus 302 while BUSY is high. Of course, even though BUSY has been described as an active HIGH signal, it may just as readily be implemented as an active LOW signal. The polarity of the active transition is not a key issue; it is overall functionality that is important.

As noted, double-buffered DACs enable rapid updating of input registers combined with simultaneous data transfer (and output voltage update) for all DACs within a device. Unfortunately, in devices of the prior art, there is no way of determining precisely how rapidly the input registers of multiple DACs can be updated, since there is no indication as to whether the internal conversion operation of a particular DAC has been completed. This is particularly disadvantageous for complex systems in which multiple DAC devices (such as device 100 of FIG. 1) are employed. Of course, it may be possible to create empirical timing routines so that associated controllers will wait long enough for conversions to be completed before attempting DAC updates, but, in high-speed systems, there may not be code space or system time to waste on such a solution. Additional hardware resources may be required, in some cases, to perform this type of function.

Accordingly, a need arises for a device interface that permits register updates to progress as rapidly as possible without interfering with ongoing data conversions, and without the need for additional system hardware to monitor conversion status.

SUMMARY OF THE INVENTION

These needs and others are satisfied by the present invention, in which an interface is disclosed that includes a built-in indication that signal processing has been completed and that data registers in data conversion devices are ready to be re-loaded.

In short, a new system design is proposed that may use a wired-OR BUSY signal to provide maximum control and flexibility. The BUSY signal remains high while a conversion is in progress anywhere in the system. While the BUSY signal is in its high logic state, BUSY prevents any DAC data register updates from occurring. In other words, even in asynchronous modes of operation, pulsing an LDAC line low will not cause a DAC data register update until BUSY once again becomes high. This characteristic can be viewed as "stalling" (delaying) the LDAC function temporarily, or, in an alternative view, "storing" the LDAC pulse so that it becomes operative on the rising edge of the BUSY signal.

In accordance with one aspect of the invention, a method for communicating between a controller and a device with double-buffered inputs comprises the steps of providing one or more communication paths for exchanging data between the controller and the device, providing a data transfer control signal from the controller to the device for transferring input data from one or more input registers into one or more latchable data registers, and providing a data transfer delay signal from the device to the controller, wherein, in a first logic state, the data transfer delay signal prevents transfer of input data from the input registers into the latchable data registers until after a transition to a second logic state occurs on the data transfer delay signal.

In one form of the invention, the step of providing one or more communication paths further comprises providing a serial data communication line and a serial clock signal communication line. The serial data communication line may be a bi-directional data communication line. The step of providing one or more communication paths could comprise, in the alternative, providing a parallel data bus and parallel data transfer control signals, and the parallel data bus may be a bi-directional parallel data bus.

In another form of the invention, the step of providing a data transfer control signal further comprises providing a data transfer control signal that latches input data from the input registers into the latchable data registers on a high-to-low logic level transition. The step of providing a data transfer control signal may further comprise providing a data transfer control signal that is held at a first logic level such that completion of a write operation to an input register controls latching of input data into the latchable data registers, subject to delay introduced by the data transfer delay signal.

In accordance with yet another form of the invention, the step of providing a data transfer delay signal from the device to the controller further comprises the step of providing an open-drain data transfer delay signal from the device to the controller. The open-drain data transfer delay signal is coupled to an internal buffer that generates a BUSY input signal on the device that prevents transfer of input data from the input registers. The device may also comprise multiple devices, where the open-drain data transfer delay signal is coupled to other data transfer delay signals from other similar devices to realize a system-wide data transfer delay signal.

In accordance with another aspect of the invention, apparatus for communicating between a controller and a device with double-buffered inputs comprises means for providing one or more communication paths for exchanging data between the controller and the device, means for providing a data transfer control signal from the controller to the device for transferring input data from one or more input registers into one or more latchable data registers, and means for providing a data transfer delay signal from the device to the controller, wherein, in a first logic state, the data transfer delay signal prevents transfer of input data from the input registers into the latchable data registers until after a transition to a second logic state occurs on the data transfer delay signal.

In one form, the means for providing one or more communication paths further comprises a serial data communication line and a serial clock signal communication line. The serial data communication line may be a bi-directional data communication line. The means for providing one or more communication paths could also comprise a parallel data bus and parallel data transfer control signals, in which the parallel data bus is a bi-directional parallel data bus.

In another form of the invention, the means for providing a data transfer control signal further comprises means for providing a data transfer control signal that latches input data from the input registers into the latchable data registers on a high-to-low logic level transition. The means for providing a data transfer control signal may comprise means for providing a data transfer control signal that is held at a first logic level, such that completion of a write operation to an input register controls latching of input data into the latchable data registers, subject to delay introduced by the data transfer delay signal.

In yet another form of the invention, the means for providing a data transfer delay signal from the device to the controller further comprises means for providing an open-drain data transfer delay signal from the device to the controller. The open-drain data transfer delay signal is coupled to an internal buffer that generates a BUSY input signal on the device that prevents transfer of input data from the input registers. The device may also comprise multiple devices, and the open-drain data transfer delay signal may be coupled to other data transfer delay signals from other similar devices to realize a system-wide data transfer delay signal.

In accordance with yet a further aspect of the invention, a communications interface for enabling communication between a controller and a device with double-buffered inputs comprises one or more communication paths for exchanging data between the controller and the device, a data transfer control signal from the controller to the device for transferring input data from one or more input registers into one or more latchable data registers, and a data transfer delay signal from the device to the controller. In a first logic state, the data transfer delay signal prevents transfer of input data from the input registers into the latchable data registers until after a transition to a second logic state occurs on the data transfer delay signal.

In one form of the invention, the communication paths comprise a serial data communication line and a serial clock signal communication line. The serial data communication line may be a bi-directional data communication line. The data transfer delay signal from the device to the controller may comprise an open-drain data transfer delay signal coupled to an internal buffer that generates a BUSY input signal on the device, that prevents transfer of input data from the input registers. The device could also comprise multiple devices, and the open-drain data transfer delay signal may be coupled to other data transfer delay signals from other similar devices to realize a system-wide data transfer delay signal.

In accordance with still a further aspect of the invention, a method for communicating between a controller and multiple data conversion devices, each of the data conversion devices including multiple DACs with double-buffered inputs, comprises the steps of providing a bi-directional serial data communication line and a serial clock signal communication line for exchanging data between the controller and the data conversion devices, providing a data transfer control signal from the controller to the data conversion devices that latches input data from input registers into interconnected latchable data registers of associated DACs on an active transition, providing open-drain, bi-directional data transfer delay signals in a wired-OR configuration from the data conversion devices to the controller, wherein, in a first logic state, the data transfer delay signal prevents transfer of input data from the input registers into the latchable data registers until after a transition to a second logic state occurs on the data transfer delay signal. In this way, when any of the data conversion devices drives the data transfer delay signal to the first logic state, transfer of input data from the input registers into the latchable data registers is inhibited in every DAC in every data conversion device that is part of the wired-OR configuration.

Further objects, features, and advantages of the present invention will become apparent from the following description and drawings.

DETAILED DESCRIPTION OF THE INVENTION

Figure 5:
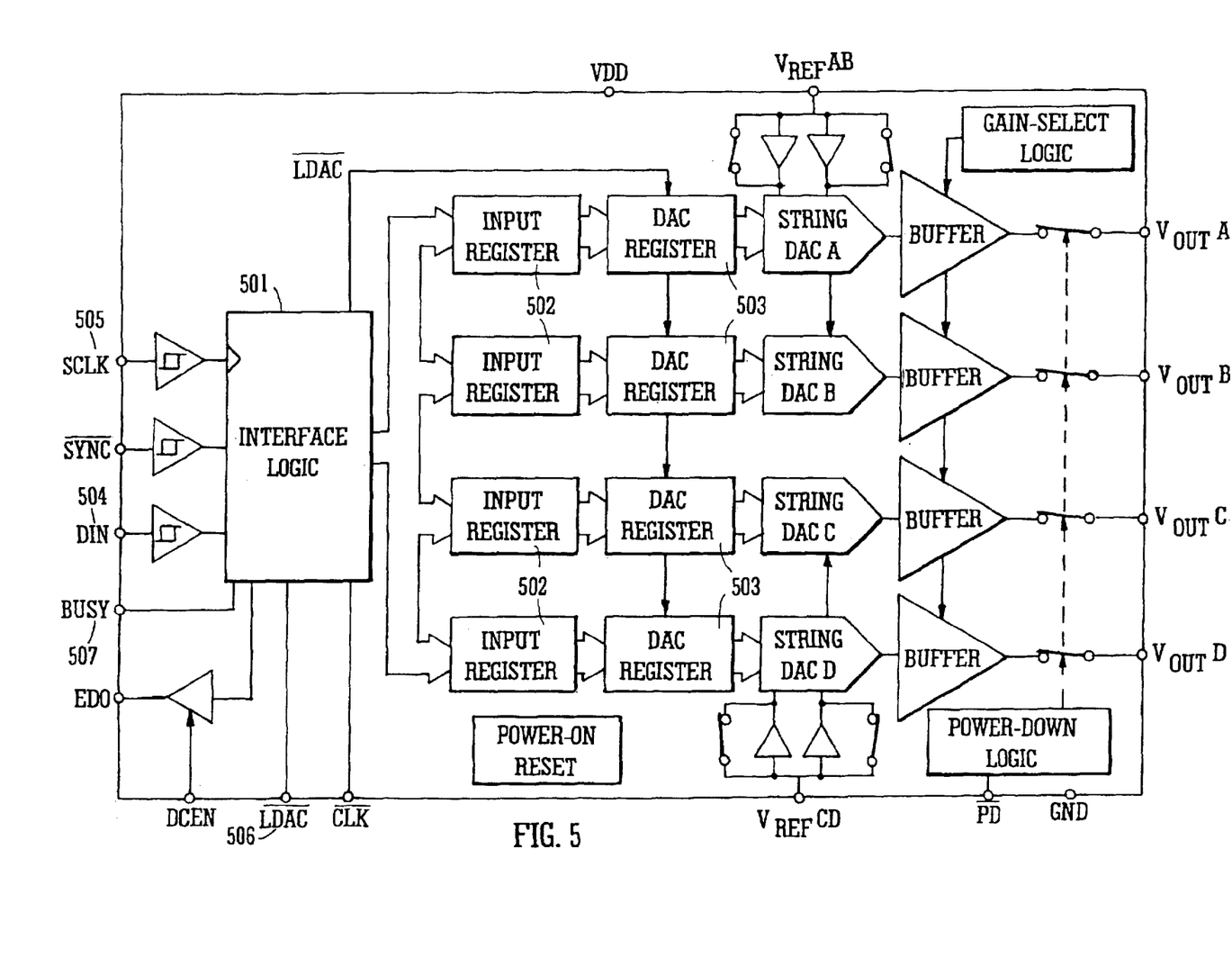
FIG. 5 is a block diagram of a device in accordance with the present invention.

There is described herein a device interface that offers distinct advantages when compared to the prior art. FIG. 5 is a block diagram depiction of a device 500 employing an interface in accordance with the present invention.

The device 500 is a data conversion device that includes multiple DACs. Double-buffering is used, so that input registers 502 can be loaded with DAC input data, while the DAC registers 503 remain latched and unaffected by information presented to the input registers 502 until certain conditions have been satisfied.

The device 500 incorporates several advantageous features. A serial communications interface is supported via a serial data communications path DIN 504 and a serial clock SCLK 505. Input data may be directed to the desired input register 502 by providing address information as part of the serial data transmission over the serial data line DIN 504. Data bits are shifted in on the low-to-high transitions of the serial clock SCLK 505. An LDAC signal 506 controls the transfer of data from the input registers 502 into the DAC registers 503, with a high-to-low transition of the LDAC signal 506 initiating the data transfer. In this way, all of the DACs on the device may be updated at the same time. This mode of operation, in which the LDAC signal 506 is normally maintained in a logic high state, then is pulsed low to initiate a data transfer, is called asynchronous device operation.

There is also a synchronous mode of operation, in which the LDAC signal 506 is simply held in a low logic state. In this synchronous mode, input data is transferred from an input register 502 to the interconnected DAC register 503 upon completion of a write operation to the input register 502. However, operation of the device 500 differs from operation of prior art devices in that the device 500 incorporates a BUSY signal 507.

The BUSY signal 507 remains in a logic high state so long as all data conversions that can take place on the device have been completed, and the DAC data registers 503 are ready to be updated with new information from the input registers 502. The BUSY signal 507 transitions to a low logic state immediately after the data interface write cycle has been completed (provided BUSY has not already been asserted, of course), and remains low until data conversion has been completed and the input registers 502 have been updated. The BUSY signal 507 then returns to its high logic level.

Of course, as noted previously, the specific logic levels involved in the active transition of BUSY could easily be reversed without adverse effect on functionality. In fact, the active transition of any of the control or status signals described herein could easily be reversed without affecting functionality. It should also be noted that the BUSY signal could be shared with other functions on one IC or multiple ICs. For example, BUSY could be shared with the power-on state machine function on a DAC integrated circuit, with a conversion time A-to-D converter BUSY signal, or with a system level reset and/or hold signal, among other possibilities. And, since multiple write cycles may be necessary under some conditions, BUSY signal timing may vary.

During the interval when the BUSY signal is low, no data transfers from the input registers 502 to the DAC registers 503 are permitted. This prohibition on updates of the DAC registers 503 even affects the synchronous mode described above. Consequently, even with the LDAC signal 506 tied to a low logic level, no update of a DAC register can occur at the completion of an input register 502 write operation unless the BUSY signal 507 is in its high logic state.

Figure 6:
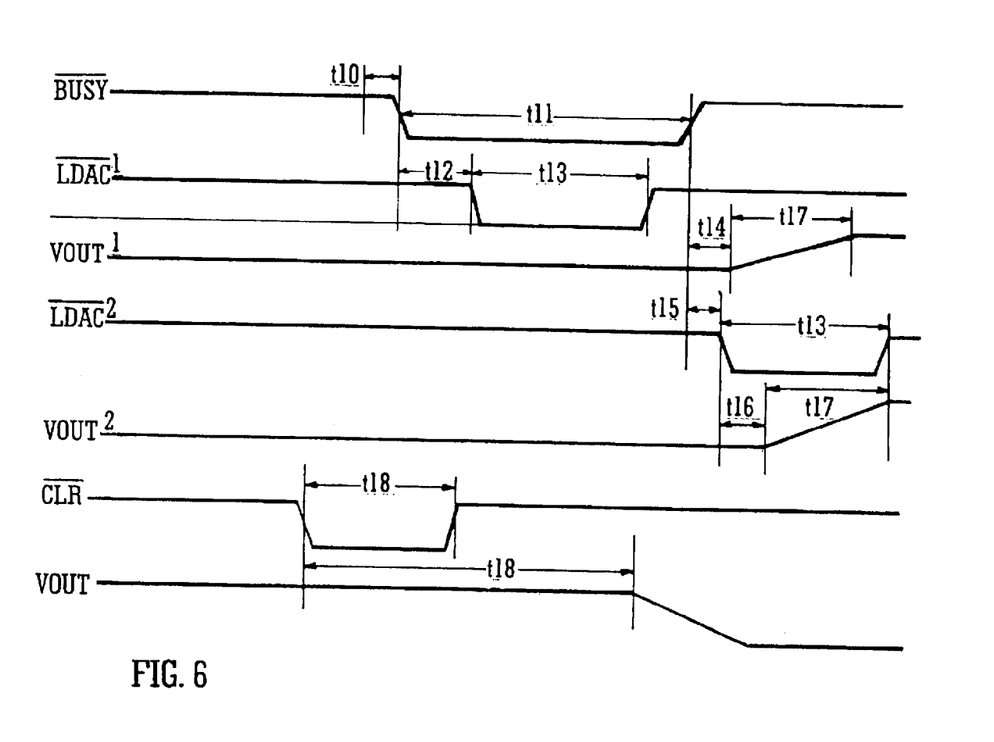
FIG. 6 is a timing diagram that illustrates operation of the device of FIG. 6.

The timing diagram of FIG. 6 illustrates the effect of the BUSY signal 507. When the signal $LDAC^1$ makes a high-to-low transition while the BUSY signal is in a logic low state, there is no immediate effect. It is not until after the rising edge of BUSY that $V_{OUT}^1$ actually begins to change its value. This is because the transfer of data from the input register 502 to the DAC register 503 (the effect of LDAC, in other words) is "delayed" or "stalled" until after BUSY returns to a high logic level.

However, when $LDAC^2$ is asserted in the timing diagram of FIG. 6, BUSY has already returned to a high logic level, and $V_{OUT}^2$ begins to change value in direct response to $LDAC^2$. As noted above, this is because the contents of the input registers 502 are immediately transferred to DAC registers 503 when LDAC is asserted, unless BUSY is in its low logic state, indicating that a conversion is still in progress. Thus, when BUSY goes HIGH, LDAC becomes active, to yield maximum update rate.

Figure 7:
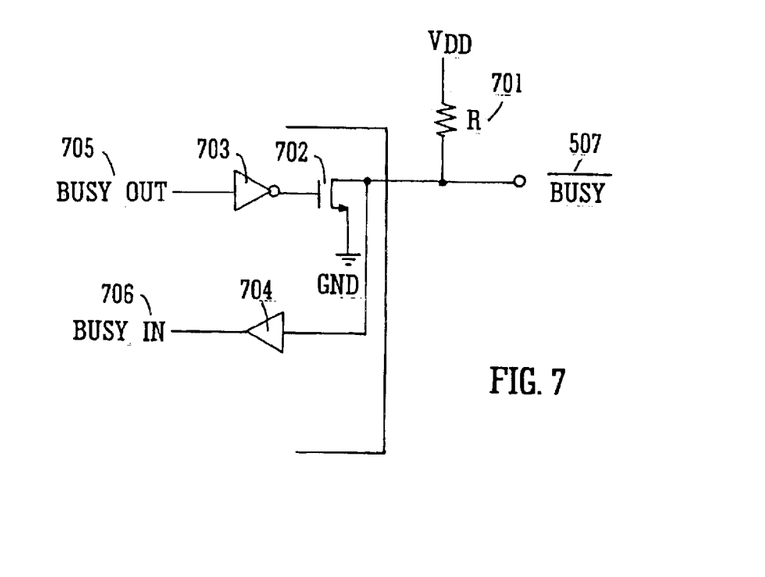
FIG. 7 is a schematic illustration of a device pin configuration.

FIG. 7 represents the BUSY pin 507 of the device 500 in more detailed, schematic form. As can be appreciated from an examination of FIG. 7, internal signal busy_out 705 is provided to an inverter/buffer 703, which in turn drives the gate of open-drain MOSFET 702. When the internal busy__out signal 705 is in its low logic state, indicating that a conversion is still in progress in the device 500, transistor 702 will turn ON, and the external BUSY pin 507 will go low. The internal busy__in signal 706, which is driven by the drain of transistor 702 through buffer 704, will also be low under these conditions, and it is this internal busy__in signal 706 that actually inhibits (stalls or delays) data transfers from input registers 502 (FIG. 5) to DAC registers 503. Of course, if another device is also connected to the BUSY pin, BUSY may already be low. That is, another device may already have pulled the BUSY signal to a low logic level.

The pin configuration depicted in FIG. 7 is readily adaptable to a wired-OR "system BUSY" connection. Since the BUSY signal 507 is open-drain, a plurality of BUSY signals from similar devices may be connected together. If a BUSY condition occurs anywhere in the system, the resulting low logic level at the BUSY pin 507 will pull down the input to buffer 704, placing the internal busy__in signal 706 in a low logic state, and inhibiting DAC data transfers and consequent DAC updates. Of course, the internal busy__in signals for all of the wired-OR devices will similarly be low, thus inhibiting DAC updates throughout the system while any conversion activity is still in progress.

It should be noted that the term "open drain," as it is used herein, does not exclude the introduction of a relatively small series impedance. Nor is the interconnection of open drain signal lines inconsistent with the insertion of clamp circuits intended to stop the open drain signal from "hanging" near the mid-threshold region for prolonged periods. For example, a back-to-back configuration of weak inverters might be used to accomplish this clamp function.

Furthermore, the controller described herein may, for example, be a microcontroller, a digital signal processor (DSP), or other master control device. There may even be more than one controller involved in the system, with each controller having the capability to monitor and/or manipulate the system BUSY control signal. Such a system may be characterized as a multi-controller or multi-master system. One of the master devices may assert the BUSY signal, thus forcing the remaining devices to wait for its release. This permits an added degree of freedom in system design.

There has been described herein a device interface that offers distinct advantages when compared with the prior art. It will be apparent to those skilled in the art that modifications may be made without departing from the spirit and scope of the invention. Accordingly, it is not intended that the invention be limited except as may be necessary in view of the appended claims.

What is claimed is:

1. A method for communicating between a controller and a Digital-to-Analog Converter (DAC) with double-buffered inputs, the method comprising the steps of:
   (a) providing one or more communication paths for exchanging data between the controller and the DAC;
   (b) providing a data transfer control signal from the controller to the DAC for transferring input data from one or more input registers into one or more latchable data registers; and
   (c) providing a data transfer delay signal from the DAC to the controller, wherein, in a first logic state, the data transfer delay signal prevents transfer of input data from said one or more input registers into said one or more latchable data registers until after a transition to a second logic state occurs on the data transfer delay signal.

2. The method in accordance with claim 1, wherein the step (a) of providing one or more communication paths further comprises providing a serial data communication line and a serial clock signal communication line.

3. The method in accordance with claim 2, wherein the serial data communication line is a bi-directional data communication line.

4. The method in accordance with claim 1, wherein the step (a) of providing one or more communication paths further comprises providing a parallel data bus and parallel data transfer control signals.

5. The method in accordance with claim 4, wherein the parallel data bus is a bi-directional parallel data bus.

6. The method in accordance with claim 1, wherein the step (b) of providing a data transfer control signal further comprises providing a data transfer control signal that latches input data from the input registers into the latchable data registers on a high-to-low logic level transition.

7. The method in accordance with claim 1, wherein the step (b) of providing a data transfer control signal further comprises providing a data transfer control signal that is held at a first logic level such that completion of a write operation to an input register controls latching of input data into the latchable data registers, subject to delay introduced by the data transfer delay signal.

8. The method in accordance with claim 1, wherein the step (c) of providing a data transfer delay signal from the DAC to the controller further comprises the step of providing an open-drain data transfer delay signal between the DAC and the controller.

9. The method in accordance with claim 8, wherein the open-drain data transfer delay signal is coupled to an internal buffer that generates a BUSY input signal on the DAC that prevents transfer of input data from said one or more input registers.

10. The method in accordance with claim 9, wherein the DAC comprises multiple DACs and the open-drain data transfer delay signal is coupled to other data transfer delay signals from other similar DACs to realize a system-wide data transfer delay signal.

11. Apparatus for communicating between a controller and a Digital-to-Analog Converter (DAC) with double-buffered inputs comprising:
   means for providing one or more communication paths for exchanging data between the controller and the DAC;
   means for providing a data transfer control signal from the controller to the DAC for transferring input data from one or more input registers into one or more latchable data registers; and
   means for providing a data transfer delay signal from the DAC to the controller, wherein, in a first logic state, the data transfer delay signal prevents transfer of input data from said one or more input registers into said one or more latchable data registers until after a transition to a second logic state occurs on the data transfer delay signal.

12. The apparatus of claim 11, wherein the means for providing one or more communication paths further comprises a serial data communication line and a serial clock signal communication line.

13. The apparatus of claim 12, wherein the serial data communication line is a bi-directional data communication line.

14. The apparatus of claim 11, wherein the means for providing one or more communication paths further comprises a parallel data bus and parallel data transfer control signals.

15. The apparatus of claim 14, wherein the parallel data bus is a bi-directional parallel data bus.

16. The apparatus of claim 11, wherein the means for providing a data transfer control signal further comprises means for providing a data transfer control signal that latches input data from the input registers into the latchable data registers on a high-to-low logic level transition.

17. The apparatus of claim 11, wherein the means for providing a data transfer control signal further comprises means for providing a data transfer control signal that is held at a first logic level such that completion of a write operation to an input register controls latching of input data into the latchable data registers, subject to delay introduced by the data transfer delay signal.

18. The apparatus of claim 11, wherein the means for providing a data transfer delay signal from the DAC to the controller further comprises means for providing an open-drain data transfer delay signal between the DAC and the controller.

19. The apparatus of claim 18, wherein the open-drain data transfer delay signal is coupled to an internal buffer that generates a BUSY input signal on the DAC that prevents transfer of input data from said one or more input registers.

20. The apparatus of claim 19, wherein the DAC comprises multiple DACs and the open-drain data transfer delay signal is coupled to other data transfer delay signals from other similar DACs to realize a system-wide data transfer delay signal.

21. A communications interface for enabling communication between a controller and a Digital-to-Analog Converter (DAC) with double-buffered inputs, the communications interface comprising:
one or more communication paths for exchanging data between the controller and the DAC;
a data transfer control signal from the controller to the DAC for transferring input data from one or more input registers into one or more latchable data registers; and
a data transfer delay signal from the DAC to the controller, wherein, in a first logic state, the data transfer delay signal prevents transfer of input data from said one or more input registers into said one or more latchable data registers until after a transition to a second logic state occurs on the data transfer delay signal.

22. The communications interface of claim 21, wherein said one or more communication paths comprise a serial data communication line and a serial clock signal communication line.

23. The communications interface of claim 22, wherein the serial data communication line is a bi-directional data communication line.

24. The communications interface of claim 21, wherein the data transfer delay signal from the DAC to the controller comprises an open-drain data transfer delay signal coupled to an internal buffer that generates a BUSY input signal on the DAC that prevents transfer of input data from said one or more input registers.

25. The communications interface of claim 24, wherein the DAC comprises multiple DACs and the open-drain data transfer delay signal is coupled to other data transfer delay signals from other similar DACs to realize a system-wide data transfer delay signal.

26. A method for communicating between a controller and multiple data conversion devices, each of said data conversion devices including multiple DACs with double-buffered inputs, the method comprising the steps of:

(a) providing a bi-directional serial data communication line and a serial clock signal communication line for exchanging data between the controller and the data conversion devices;

(b) providing a data transfer control signal from the controller to the data conversion devices that latches input data from input registers into interconnected latchable data registers of associated DACs on an active transition;

(c) providing open-drain, bi-directional data transfer delay signals in a wired-OR configuration from the data conversion devices to the controller, wherein, in a first logic state, the data transfer delay signal prevents transfer of input data from said input registers into said latchable data registers until after a transition to a second logic state occurs on the data transfer delay signal;

such that, when any of the data conversion devices drives the data transfer delay signal to said first logic state, transfer of input data from said input registers into said latchable data registers is inhibited in every data conversion device that is part of the wired-OR configuration.

* * * * *